United States Patent
Yin et al.

(10) Patent No.: US 11,990,903 B1
(45) Date of Patent: May 21, 2024

(54) LOW-POWER LOW-VOLTAGE DIFFERENTIAL SIGNALING RECEIVER WITH SIGNAL DISTORTION CORRECTION

(71) Applicant: QUALCOMM Incorporated, San Diego, CA (US)

(72) Inventors: Wenjing Yin, San Diego, CA (US); Debesh Bhatta, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/987,751

(22) Filed: Nov. 15, 2022

(51) Int. Cl.
  *H03K 19/01* (2006.01)
  *G06F 1/04* (2006.01)
  *H03F 1/30* (2006.01)
  *H03F 1/32* (2006.01)
  *H03F 3/45* (2006.01)
  *H03K 19/0185* (2006.01)
  *H03K 19/20* (2006.01)
  *H04B 1/16* (2006.01)

(52) U.S. Cl.
  CPC ....... *H03K 19/018528* (2013.01); *G06F 1/04* (2013.01); *H03F 1/301* (2013.01); *H03F 1/3211* (2013.01); *H03F 3/45273* (2013.01); *H03K 19/20* (2013.01); *H04B 1/16* (2013.01)

(58) Field of Classification Search
  CPC ................. H03K 19/01; H03K 19/017; H03K 19/01728; H03K 19/018521; H03K 19/018528; H03F 1/30; H03F 1/301; H03F 1/32; H03F 1/3205; H03F 1/3211; H03F 1/3241; H03F 1/3276; H03F 3/45; H03F 3/45071; H03F 3/45076; H03F 3/45179; H03F 3/45273; H04B 1/04; H04B 1/16; H04B 2001/0408; H04B 2001/0425; H04B 2001/0441; G06F 1/04; G06F 1/06
  See application file for complete search history.

(56) References Cited

U.S. PATENT DOCUMENTS

| | | | |
|---|---|---|---|
| 7,196,556 B1* | 3/2007 | Nguyen | H04L 25/0272 326/82 |
| 7,667,546 B2 | 2/2010 | Kim | |
| 8,570,072 B2* | 10/2013 | Gozali | H03K 3/3565 327/63 |
| 11,381,225 B1 | 7/2022 | Lu et al. | |
| 2006/0012408 A1 | 1/2006 | Kushner | |

OTHER PUBLICATIONS

Traversi G., et al., "Design of LVDS Driver and Receiver in 28 nm CMOS Technology for Associative Memories", 2017 6th International Conference on Modern Circuits and Systems Technologies (MOCAST), May 2017, 4 Pages.

(Continued)

*Primary Examiner* — Long Nguyen
(74) *Attorney, Agent, or Firm* — Haynes and Boone, LLP

(57) ABSTRACT

A low-voltage differential signaling receiver is provided that amplifies a differential input voltage to produce a differential output voltage. A signal distortion circuit that detects a distortion in a differential output voltage to assert a signal detection signal that adjusts a gate voltage of a pair of load transistors to reduce the distortion. The load transistors are selectively diode connected to reduce power consumption.

20 Claims, 7 Drawing Sheets

(56) References Cited

OTHER PUBLICATIONS

Nunez J., et al., "Design Methodology for Low-Jitter Differential Clock Recovery Circuits in High Performance ADCs", Analog Integrated Circuits and Signal Processing, Springer New York LLC, US, vol. 89, No. 3, Oct. 3, 2016, pp. 593-609, XP036095694, 17 Pages, Section 2.2, Figure 3.
Partial International Search Report—PCT/US2023/036930—ISA/EPO—Mar. 1, 2024.

* cited by examiner

LOW-POWER LOW-VOLTAGE DIFFERENTIAL SIGNALING RECEIVER WITH SIGNAL DISTORTION CORRECTION

TECHNICAL FIELD

This application relates to low-voltage differential signaling (LVDS), and more particularly, to a low-power LVDS receiver with signal distortion correction.

BACKGROUND

For reduced power consumption and other benefits, an integrated circuit may generate signals such as clock signals using an LVDS transmitter. Since such signaling is differential, the LVDS transmitter generates both a positive component signal and a negative component signal that is the complement of the positive component signal. Both the positive component signal and the negative component signal oscillate between a low voltage and high voltage. But the high voltage may barely satisfy or even be less than a transistor threshold voltage. Despite this relatively reduced difference between high and low voltages, an LVDS receiver should amplify the difference between the positive and negative component signals to generate a "full rail" differential output signal having positive and negative component signals that transition between ground and a power supply voltage. The resulting amplification may consume substantial power. In addition, the LVDS receiver may be subjected to voltage and/or current couplings that result in the received differential signal being distorted. Should the distortion be severe, the LVDS receiver may produce a glitch (a condition in which the differential output signal does not transition despite a transition in the received LVDS signal).

SUMMARY

In accordance with an aspect of the disclosure, a low-voltage differential signaling receiver is provided that includes: a differential pair of transistors configured to amplify a differential input voltage into a first differential voltage defined between a drain of a first transistor in the differential pair of transistors and a drain of a second transistor in the differential pair of transistors; a first current mirror configured to produce a first current responsive to a drain voltage of the first transistor; a first load transistor configured to conduct the first current to produce a first voltage, the first load transistor being selectively diode connected through a first switch; a second current mirror configured to produce a second current responsive to a drain voltage of the second transistor; and a second load transistor configured to conduct the second output current to produce a second voltage, the second load transistor being selectively diode connected through a second switch.

In accordance with another aspect of the disclosure, a method of receiving in a low-voltage differential signaling receiver is provided that includes: detecting a distortion in a differential output voltage produced by the low-voltage differential signaling receiver; and adjusting a gate voltage of a first load transistor and of a second load transistor responsive to the detection of the distortion.

In accordance with additional aspect of the disclosure, a low-voltage differential signaling receiver is provided that includes: a non-overlapping clock generator configured to generate a pair clock signals responsive to a differential output voltage; a logic gate configured to process the pair of non-overlapping clock signals to produce a signal distortion detection signal at an output terminal of the logic gate; a differential amplifier including a first load transistor and a second load transistor; and a third transistor coupled between ground and a gate of the first load transistor and a gate of the second load transistor, the third transistor having a gate coupled to the output terminal of the logic gate.

In accordance with yet another aspect of the disclosure, a low-voltage differential signaling receiver is provided that includes: a non-overlapping clock generator configured to generate a pair of clock signals responsive to a differential output voltage; a logic gate configured to process the pair of clock signals to produce a signal distortion detection signal at an output terminal of the logic gate; a differential amplifier including a first load transistor and a second load transistor; and a third transistor coupled between a power supply node and a gate of the first load transistor and a gate of the second load transistor, the third transistor having a gate coupled to the output terminal of the logic gate.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figure.

DETAILED DESCRIPTION

As noted earlier, an LVDS receiver amplifies the difference between the positive and negative components of a received LVDS signal to produce a full-rail output signal. To provide this amplification, existing LVDS receivers may consume substantial power and also be subjected to duty cycle distortion in the output signal from aberrations in the power supply voltage or current. An LVDS receiver is disclosed herein that advantageously offers reduced power consumption and improved robustness to duty cycle distortions.

Figure 1:
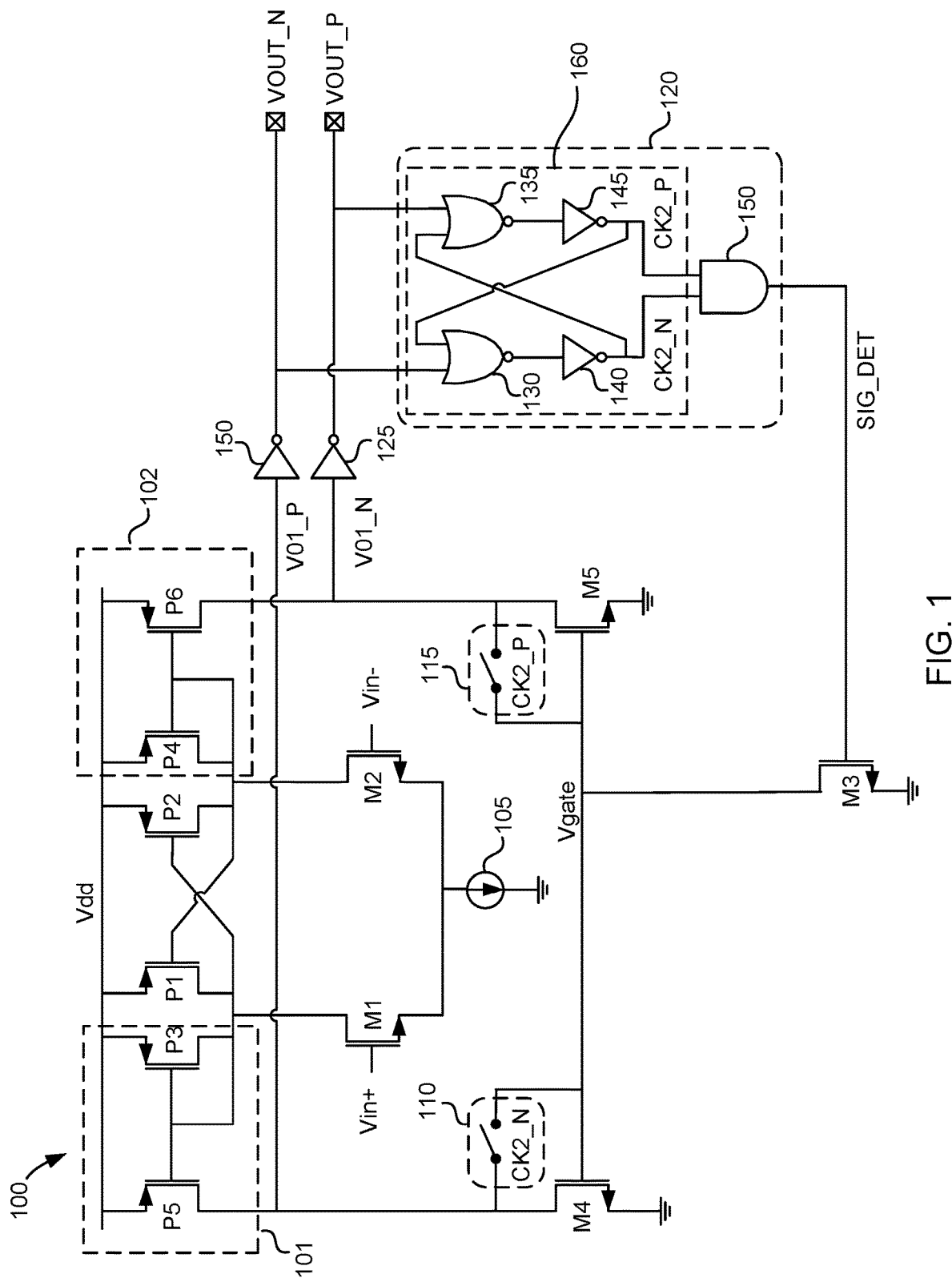
FIG. 1 is a circuit diagram of an LVDS receiver including a signal distortion correction circuit in accordance with an aspect of the disclosure.

An example LVDS receiver 100 is shown in FIG. 1 that includes a differential pair of n-type metal-oxide semiconductor (NMOS) transistors M1 and M2. A positive component Vin+ of a differential input voltage drives a gate of transistor M1. Conversely, a negative component Vin− of the differential input voltage drives a gate of transistor M2. The sources of transistors M1 and M2 couple to ground through a current source 105 that conducts a bias current. This bias current may also be denoted herein as a tail current. Transistor M1 is also denoted herein as an example of a first transistor whereas transistor M2 is an example of a second transistor. Should Vin+ equal Vin−, each transistor M1 and M2 will conduct one-half of the tail current. But as Vin+ becomes greater than Vin−, transistor M1 will conduct more of the tail current as compared to transistor M2. This shifting of the majority of the tail current through transistor M1 causes the drain voltage of transistor M1 to decrease and causes the drain voltage of transistor M2 to increase. Conversely, transistor M2 will conduct more of the tail current as compared to transistor M1 as Vin− becomes greater than Vin+. This shifting of the majority of the tail current through transistor M2 causes the drain voltage of transistor M2 to decrease and causes the drain voltage of transistor M1 to increase.

To amplify this change in the drain voltages of transistors M1 and M2 in response to the differential input voltage, the differential pair of transistors M1 and M2 may be coupled to a cross-coupled pair of p-type metal-oxide semiconductor (PMOS) transistors P1 and P2. In particular, the drain of transistor M1 couples to a drain of transistor P1. Similarly, the drain of transistor M2 in couples to a drain of transistor P2. As implied by the "cross-coupled" designation, the drain of the transistor P1 couples to a gate of transistor P2 whereas the drain of transistor P2 couples to a gate of transistor P1. Given this cross coupling, a decrease in the drain voltage of transistor M1 will tend to switch on transistor P2 to support the increase in the drain voltage of transistor M2. This same increase in the drain voltage of transistor M2 tends to switch off transistor P1 so that transistor P1 does not counter the decrease in the drain voltage of transistor M1. Similarly, a decrease in the drain voltage of transistor M2 will tend to switch on transistor P1 to support the increase in the drain voltage of transistor M1. This same increase in the drain voltage of transistor M1 tends to switch off transistor P2 so that transistor P2 does not counter the decrease in the drain voltage of transistor M2. In this fashion, the cross-coupled pair of transistors P1 and P2 increase the gain of the differential pair of transistors M1 and M2 with respect to amplifying the difference in the differential input voltage.

To further increase the gain of LVDS receiver 100, LVDS receiver 100 includes a first current mirror 101 and a second current mirror 102. First current mirror 101 includes a first diode connected PMOS transistor P3 having its gate and drain coupled to a gate of a first current source PMOS transistor P5. The gate and drain of first diode connected transistor P3 also couple to the drain of transistor M1. Second current mirror 102 includes a second diode connected PMOS transistor P4 having its gate and drain coupled to a gate of a second current source PMOS transistor P6. The gate and drain of second diode connected transistor P4 also couples to the drain of transistor M2. The sources of transistor P1, P2, P3, P4, P5, and P6 couple to a power supply node for a power supply voltage Vdd.

As the drain voltage of transistor M1 drops, first diode connected transistor P3 will conduct more current, which is mirrored into a mirrored current conducted out of the drain of first current source transistor P5. So that this mirrored current may produce a first voltage VO1_P, the drain of first current source transistor P5 couples to ground through an active load formed by an NMOS transistor M4. Transistor M4 is an example of a first load transistor. As the drain voltage of transistor M2 drops, second diode connected transistor P4 will conduct more current, which is mirrored into a mirrored current conducted out of the drain of second current source transistor P6. So that this mirrored current may produce a second voltage VO1_N, the drain of second current source transistor P6 couples to ground through an active load formed by an NMOS transistor M5. The gate of transistor M5 couples to the gate of transistor M4. Transistor M5 is an example of a second load transistor.

Given the gain increase from the differential pair of transistor M1 and M2, the cross-coupled pair of transistors P1 and P2, first current mirror 101, and second current mirror 102, a relatively small peak-to-peak difference in the differential input voltage produces a relatively large peak-to-peak difference in the first output voltage. In one example implementation, the differential input voltage may have a common-mode voltage of 300 mV with each of Vin+ and Vin− having a maximum value of 400 mV and a minimum value of 200 mV (a peak-to-peak difference of 200 mV). But VO1_P and VO1_N may have a minimum value of approximately 100 mV and a maximum value of 500 to 600 mV (a peak-to-peak difference of 400 to 500 mV). Given this amplification of the differential input voltage, an inverter 150 may be used to invert VO1_P to form a negative component VOUT_N of a differential output voltage. Similarly, an inverter 125 may be used to invert VO1_N to form a positive component Vout_P of the differential output voltage. The differential input voltage is thus amplified by receiver 100 to form rail-to-rail (ranging between ground and the power supply voltage Vdd) output voltages.

Although LVDS receiver 100 may advantageously amplify the relatively small peak-to-peak difference or amplitude of the differential input voltage, note that the active load transistors M4 and M5 should operate in the saturation region. To ensure that transistors M4 and M5 operate in saturation, transistors M4 and M5 may be diode connected. But the resistance of a diode connected transistor is relatively low. As noted earlier, the peak values of the VOUT_P and VOUT_N voltages is relatively high such as 500 to 600 mV. Such relatively high voltage would then produce relatively large amounts of current conducted into ground through transistors M4 and M5 should these transistors be diode connected. To ensure saturation yet avoid the current loss of a diode connection, transistors M4 and M5 are selectively diode connected. In particular, the gate and drain of transistor M4 may be coupled together through a closing of a switch 110. Similarly, the gate and drain of transistor M5 may be coupled together through a closing of a switch 115. With regard to the selective closing and opening of switches 110 and 115, note that the VOUT_P and VOUT_N voltages are controlled as discussed further herein to have a substantially 50-50 duty cycle. The VO1_P voltage will thus be relatively high during a first half cycle of the output voltage while the VO1_N voltage is relatively low. Conversely, the VO1_N voltage will be relatively high during a second half cycle of the output voltage while the VO1_P voltage is relatively low. As will be explained further herein, switch 110 is thus controlled to be open during the half cycles in which VOUT_P is relatively high and closed during the half cycles in which VOUT_P is relatively low. Similarly, switch 115 opens during the half cycles in which VOUT_N is relatively high and closes during the half cycles in which VOUT_N is relatively low. LVDS receiver 100 thus advantageously conserves power yet maintains the active loads formed by transistors M4 and M5 in saturation.

Due to non-idealities, the power supply voltage Vdd may have transients in which it is undesirably high or low as compared to its default value. Similarly, the tail current conducted by current source 105 may have non-idealities in which the tail current is undesirably high or low as compared to its default value. These surges in the power supply voltage or the tail current can produce duty cycle distortions in the differential output voltage formed by VOUT_P and VOUT_N. To correct for these duty cycle distortions, LVDS receiver 100 may include a signal distortion correction circuit 120. Signal distortion correction circuit 120 includes a non-overlapping clock signal generator 160 that generates clock signals CK2_P and CK2_N from the output voltage signals VOUT_P and VOUT_N. There are a variety of architectures that may be used to construct non-overlapping clock signal generator 160. In one implementation, non-overlapping clock signal generator 160 includes a pair of logic gates such a NOR gate 130 and a NOR gate 135 although it will be appreciated that NAND gates may be used in alternative implementations. NOR gate 130 NORs VOUT_N with the CK2_P clock signal. Similarly, NOR gate 135 NORs VOUT_P with the CK2_N clock signal. An output of NOR gate 130 is delayed through such as through an inverter 140 to form CK2_N. Similarly, an output of NOR gate 135 is delayed through an inverter 145 to form CK2_P. It will be appreciated that the delay of the output signals of NOR gates 130 and 135 may be produced by a plurality of serially coupled inverters in alternative implementations. An output terminal of NOR gate 130 and an output terminal of NOR gate 135 thus each couples to a delay circuit formed by at least one inverter. Each of NOR gates 130 and 135 is an example of a first NOR gate or a second NOR gate as denoted herein.

Should there be no distortion of the VO1_N and VO1_P voltages, the clock signals CK2_P and CK2_N are not simultaneously high (charged to the power supply voltage Vdd) at the same time. But suppose that an aberration in the power supply voltage Vdd or the tail current causes one or both of VO1_N and the VO1_P voltages to not rise above the trip point of their respective inverters 125 and 150. The output voltages VOUT_N and VOUT_P may then experience a duty cycle distortion such that they do not properly transition in response to the transitions of VO1_P and VO1_N voltages. Due to this distortion, clock signals CK2_P and CK2_N may experience a duty cycle distortion such that both the CK2_P and CK2_N signals may be high at the transitions (rising and falling edges) of the VO1_N and VO1_P voltages.

To force the output voltages VOUT_N and VOUT_P to transition despite this distortion in the VO1_P and VO1_N voltages, signal distortion correction circuit 120 may include a logic gate such as an AND gate 150 that processes the CK2_N and CK2_P signals to produce a detection signal SIG_DET that is only asserted to the power supply voltage Vdd when both the CK2_N and CK2_P voltages are both high simultaneously. The detection signal SIG_DET drives a gate of an NMOS transistor M3 that couples between the gates of transistors M4 and M5 and ground. A drain of transistor M3 thus couples to the gates of transistors M4 and M5 whereas a source of transistor M3 couples to ground. Transistor M3 is an example of a third transistor as denoted herein. Without any signal distortion, the detection signal SIG_DET is discharged such that transistor M3 is off and does not affect a voltage Vgate at the gates of transistor M4 and M5. But in the presence of signal distortion that causes both the clock signals CK2_P and CK2_N to be simultaneously high, signal distortion correction circuit 120 asserts the detection signal SIG_DET, which switches on transistor M3 to cause the gate voltage Vgate of transistors M4 and M5 to drop. At the transition of the VO1_P and VO1_N voltages, one of the voltages will be increasing (having a rising edge). The reduced conduction by transistors M4 and M5 causes this rising one of the VO1_P and VO1_N voltages to rise higher than it would in the absence of the detection signal assertion. This increase in the maximum values of the VO1_P and VO1_N voltages may then exceed the threshold voltage of the corresponding inverter 125 or 150. The output voltages VOUT_N and VOUT_P will thus transition (one having a rising edge and the other having a falling edge) despite the distortion in the VO1_P and VO1_N voltages.

Switch 110 is controlled by the CK2_N signal such that switch 110 opens when the CK2_N signal is low and closes when the CK2_N signal is high. Similarly, the CK2_P signal controls switch 115 to close when the CK2_P signal is high and to open when the CK2_N signal is low. The desired selective diode connection of transistors M4 and M5 discussed earlier is thus controlled by the CK2_P and CK2_N signals.

Figure 2A:
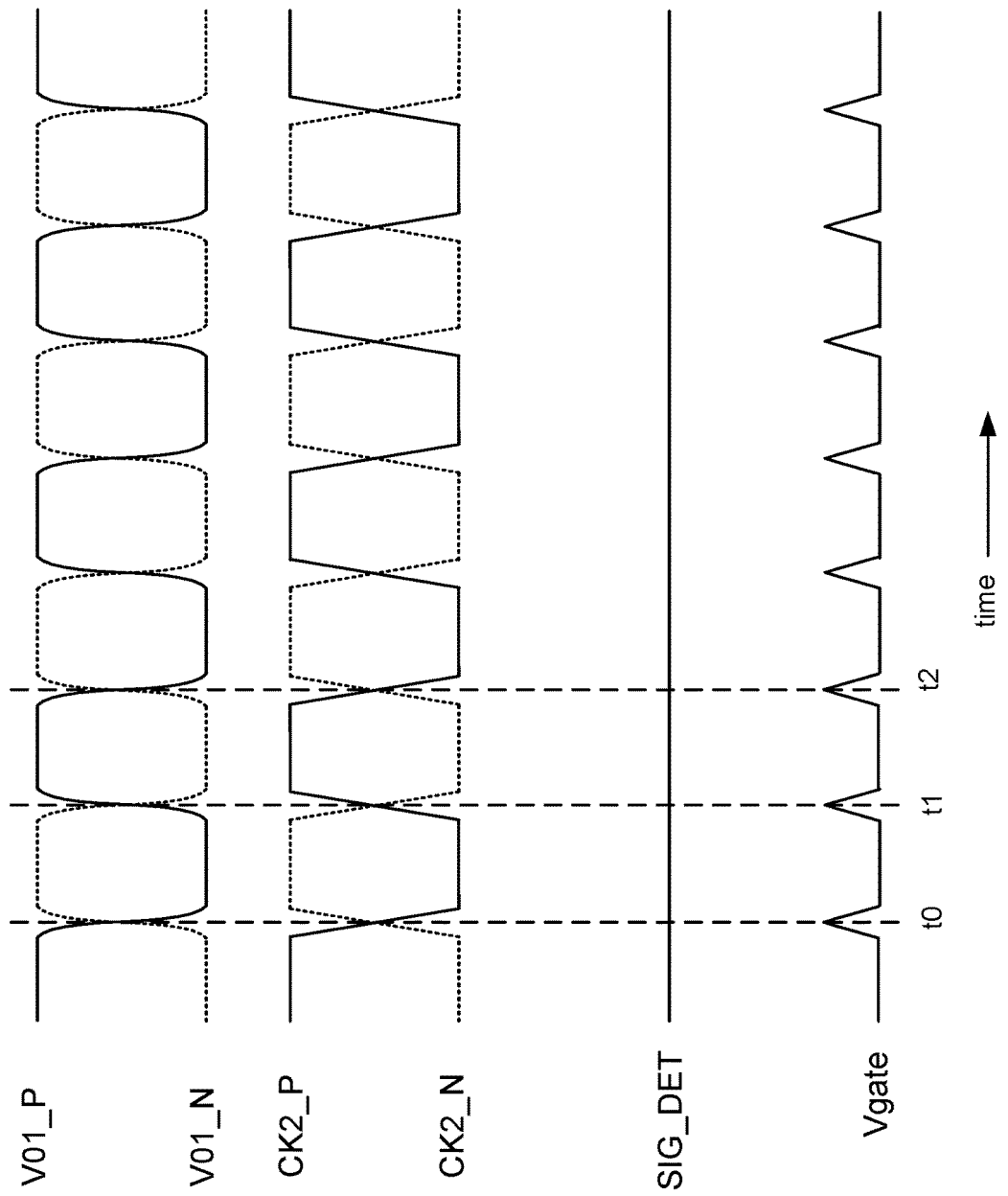
FIG. 2A illustrates some waveforms for the LVDS receiver of FIG. 1 during operation without any significant signal distortion.

Some example waveforms for LVDS receiver 100 are shown in FIG. 2A for operation in which the VO1_P and VO1_N voltages are not distorted. An example transition occurs at a time t0 in which the VO1_P voltage has a falling edge and the VO1_N voltage has a rising edge. The CK2_N signal thus has a rising edge at time t0 whereas the CK2_P signal has a falling edge. Given the non-overlapping generation of the CK2_N and CK2_P signal, the CK2_P signal has a falling edge in advance of time t0 whereas the CK2_N signal does not rise to the power supply voltage Vdd until a delay after time to. There is thus no overlap in which the CK2_N and CK2_P signals are simultaneously charged to the power supply voltage Vdd. The half cycle that began at time t0 ends with another transition at a time t1 in which the VO1_N voltage has a falling edge whereas the VO1_P voltage has a rising edge. A full cycle of the output voltages ends at time t2 with another falling edge in the CK2_P signal and another rising edge in the CK2_N signal.

Given the non-overlapping generation of the CK2_N and CK2_P signals, there is a brief period during each transition in which both the transistors M4 and M5 are diode connected. The gate voltage Vgate of the transistor M4 and M5 thus rises slightly at each transition. Since the detection signal SIG_DET is not asserted, there is no effect of the detection signal SIG_DET on the gate voltage Vgate.

Figure 2B:
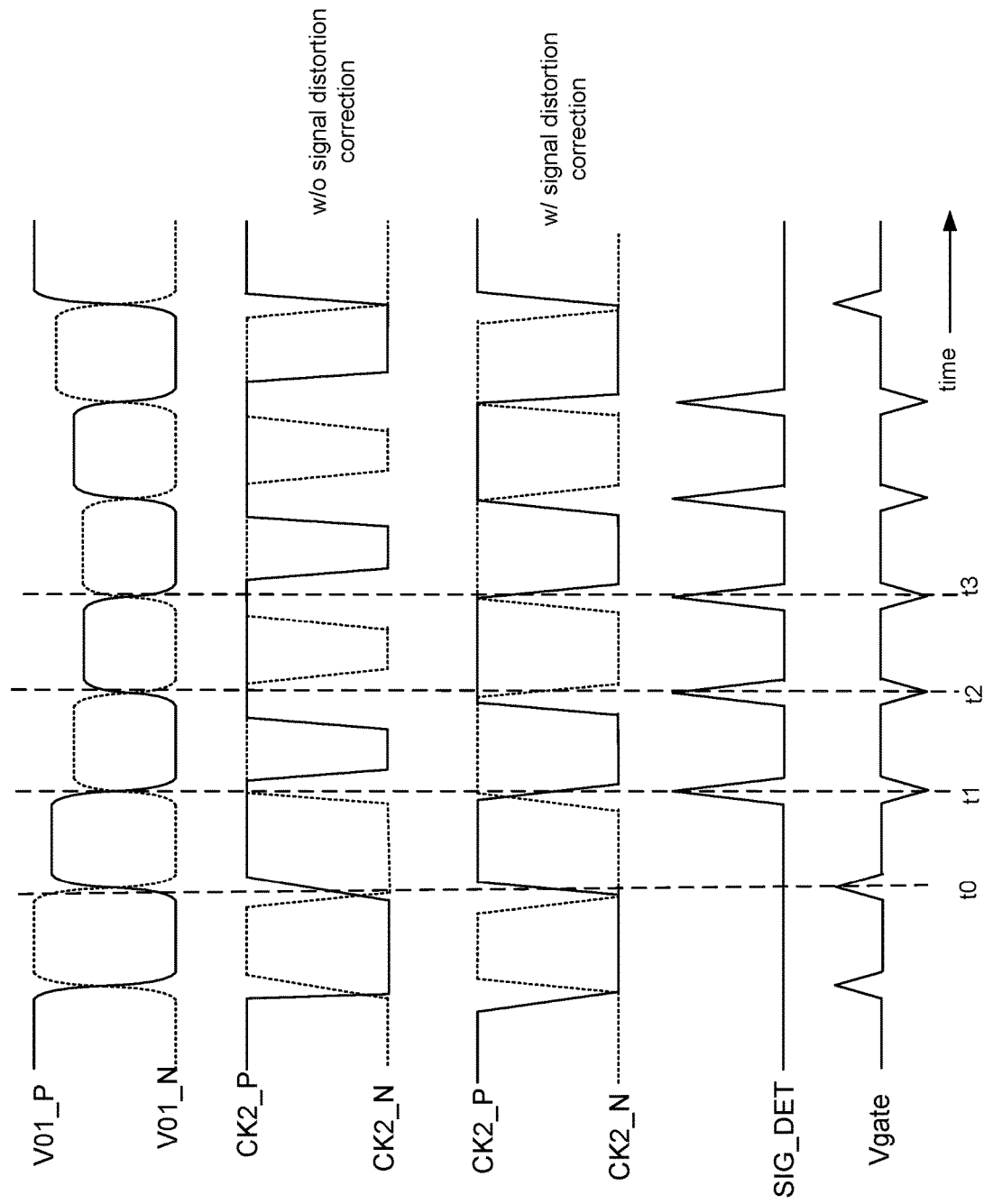
FIG. 2B illustrates some waveforms for the LVDS receiver of FIG. 1 during operation with some moderate signal distortion.

Some example waveforms for LVDS receiver 100 are shown in FIG. 2B for operation in which a relatively minor amount distortion of the VO1_P and VO1_N voltages occurs. The distortion begins at a time t0 in which VO1_P has a rising edge. Due to the signal distortion, VO1_P does not rise as robustly at time t0 as it did in preceding cycles without distortion. The distortion continues to worsen at the subsequent transition at a time t1 in which the maximum value for the VO1_N voltage drops even further. At time t1 there is thus an overlap in the CK2_P and CK2_N signals such that both are simultaneously equal to the power supply voltage Vdd at time t1. This distortion of the VO1_N and VO1_P voltage continues through a subsequent transition at time t2, which is followed by another transition at time t3. Without any signal distortion correction, there is thus a relatively substantial amount of time at each transition at times t1, t2 and t3 in which both the CK2_P and CK2_N signals are simultaneously both high. In the presence of signal distortion correction, this simultaneous assertion of the CK2_N and CK2_P signals causes a relatively brief assertion of the detection voltage SIG_DET. The gate voltage Vgate of transistors M4 and M5 thus temporarily decreases each time the detection signal SIG_DET is asserted, which forces the overlap between the CK2_N and CK2_P signals to be reduced. Eventually, the signal distortion ceases such that the detection signal SIG_DET is no longer asserted. Since transistors M4 and M5 should remain in saturation despite the reduction of their gate voltage Vgate, transistor M3 may be sized so as to be relatively small compared to transistors M4 and M5 so as to not excessively discharge the gate voltage Vgate and force transistors M4 and M5 out of saturation.

Figure 2C:
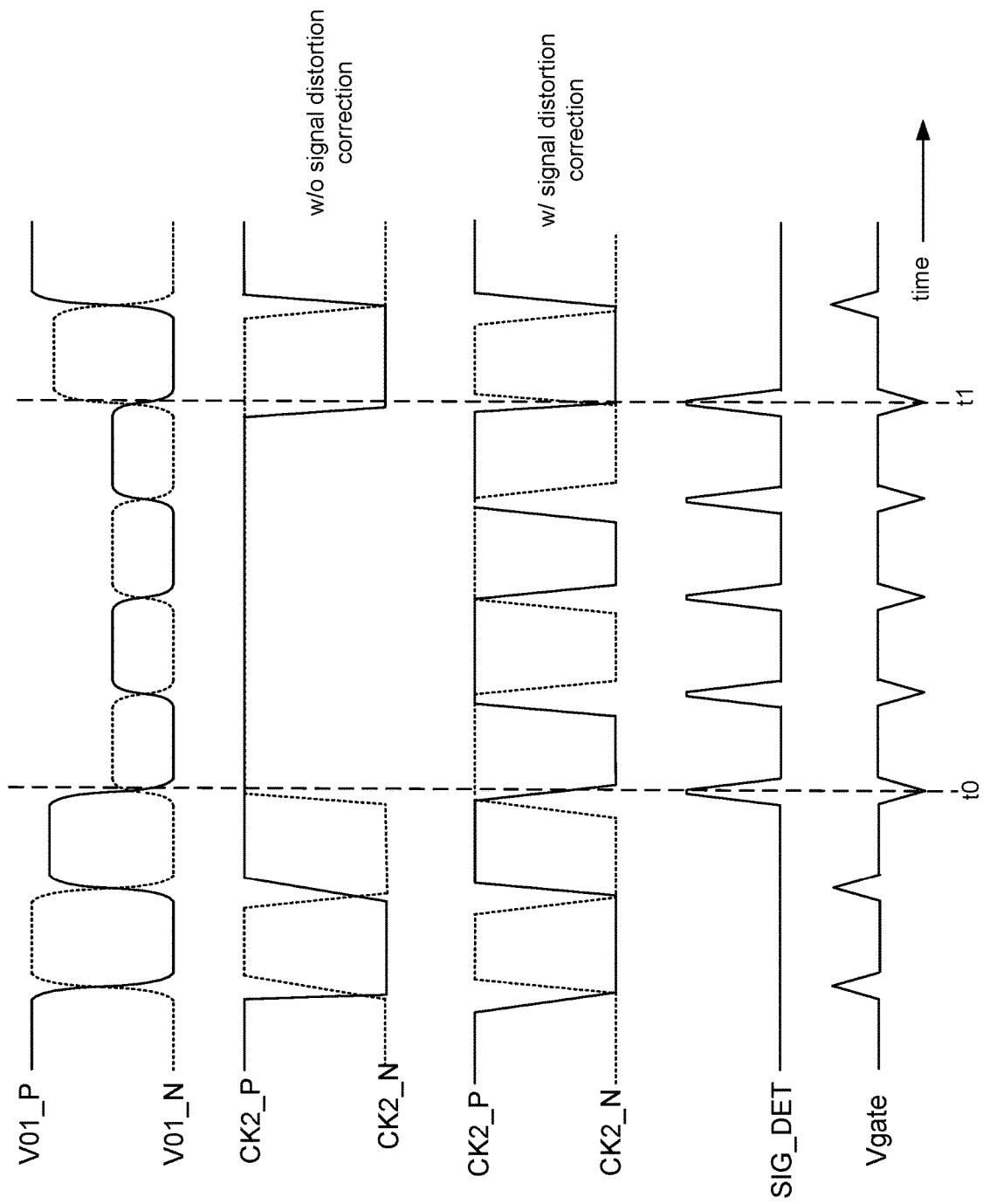
FIG. 2C illustrates some waveforms for the LVDS receiver of FIG. 1 during operation with some more pronounced signal distortion.

Some example waveforms for LVDS receiver 100 are shown in FIG. 2C for operation in which a relatively larger amount distortion of the VO1_P and VO1_N voltages occurs. At a transition at a time t0 during which the VO1_N voltage has a rising edge, the distortion is so strong that the VO1_N voltage does not rise to the transition voltage of inverter 125. This distortion continues for several transitions until a time t1 in which the distortion ceases. Given the insufficient toggling of the VO1_N and VO1_P voltages, both the CK2_P and CK2_N signals remain high from time t0 to time t1 in the absence of signal distortion correction. But with signal distortion correction, the detection voltage SIG_DET is asserted at each transition from time t0 to time t1. The CK2_N and CK2_P signals are thus forced to toggle with relatively little overlap. Similarly, the output voltages VOUT_N and VOUT_P (not illustrated in FIG. 2C) are also forced to toggle, thus preventing missing cycles in the output voltages.

Figure 3:
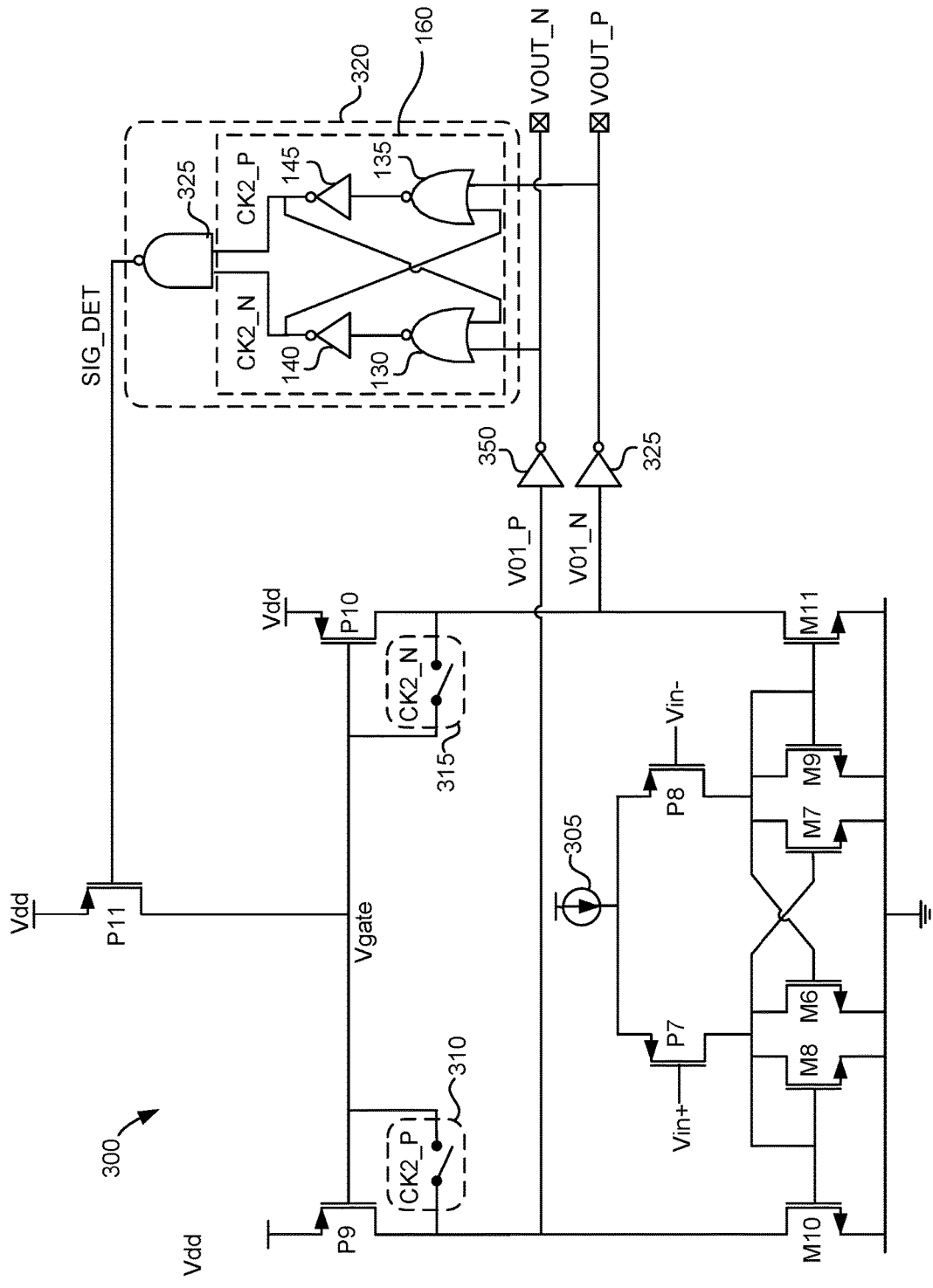
FIG. 3 is a circuit diagram of an LVDS receiver including a signal distortion correction circuit in accordance with an aspect of the disclosure.

Rather than using an NMOS differential pair of transistors like M1 and M2, an LVDS receiver as disclosed herein may be implemented using a PMOS differential pair of transistors. An example LVDS receiver 300 with a PMOS differential pair of transistors P7 and P8 is shown in FIG. 3. A current source 305 couples between the sources of transistors P7 and P8 and the power supply node to bias transistors P7 and P8 with a tail current as discussed analogously for current source 105. Transistors P7 and P8 couple to a cross-coupled pair of NMOS transistors M6 and M7 analogously as discussed for the cross-coupled pair of transistors P1 and P2. The drain of transistor M6 couples to the drain of transistor P7. Similarly, the drain of transistor M7 couples to the drain of transistor P8. To complete the cross-coupling, the drain of transistor M6 couples to the gate of transistor M7 whereas the drain of transistor M7 couples to the gate of transistor M6.

Should the Vin+ voltage rise higher than the Vin− voltage, the tail current will tend to predominately flow through transistor P8, which causes the drain voltage of transistor P8 to rise. This rise in the drain voltage of P8 tends to switch on transistor M6 to lower the drain voltage of transistor P7. Should the Vin− voltage rise higher than Vin+ voltage, the tail current will tend to predominately flow through transistor P7, which causes the drain voltage of transistor P7 to rise. This rise in the drain voltage of P7 tends to switch on transistor M7 to lower the drain voltage of transistor P8. The differential input voltage difference is thus amplified into a differential voltage across the drains of transistors P7 and P8.

To further amplify this voltage difference, LVDS receiver 300 includes a first current mirror formed by a diode connected NMOS transistor M8 having a gate connected to a gate of a current source NMOS transistor M10. The drain and gate of the diode connected transistor M8 couple to the gate of the current source transistor M10. In addition, LVDS receiver 300 includes a second current mirror formed by a diode connected NMOS transistor M9 having a gate connected to a gate of a current source transistor M11. The drain and gate of the diode connected transistor M9 couple to the gate of the current source transistor M11. The sources of transistors M6, M7, M8, M9, M10, and M11 couple to ground.

Current source transistor M10 conducts a mirrored version of a current conducted by diode connected transistor M8. As the drain voltage of transistor P7 increases, the current conducted by current source transistor M10 will increase. To produce a first voltage VO1_P in response to the current conducted by current source transistor M10, the drain of current source transistor M10 couples to the power supply node through an active load formed by a PMOS transistor P9. Transistor P9 is an example of a first load transistor as denoted herein. Similarly, current source transistor M11 conducts a mirrored version of a current conducted by diode connected transistor M9. As the drain voltage of transistor P8 increases, the current conducted by current source transistor M11 will increase. To produce a second voltage VO1_N in response to the current conducted by current source transistor M11, the drain of current source transistor M11 couples to the power supply node through an active load formed by a PMOS transistor P10. Transistor P10 is an example of a second load transistor as denoted herein.

PMOS transistors P9 and P10 in LVDS receiver 300 are analogous to transistors M4 and M5 in LVDS receiver 100. A drain and gate of transistor P9 are thus selectively coupled through a switch 310. Similarly, a drain and gate of transistor P10 are selectively coupled through a switch 315. The gates of transistors P9 and P10 couple through PMOS transistor P11 to the power supply node. The detection signal SIG_DET drives the gate of transistor P11 to control a gate voltage Vgate at the gates of transistors P9 and P10. Transistor P11 is an example of a third transistor as denoted herein.

To produce the differential output voltage formed by the voltages VOUT_P and VOUT_N, the drain of current source transistor M10 couples to an input terminal of an inverter 350 whereas the drain of current source transistor M11 couples to an input terminal of an inverter 325. Inverter 350 thus functions to invert the VO1_P voltage to produce the VOUT_N voltage. Similarly, inverter 325 inverts the VO1_N voltage to produce the VOUT_P voltage.

LVDS receiver 300 includes non-overlapping clock generator 160 that may be implemented as discussed with regard to LVDS receiver 100 to produce the CK2_N and CK_P signals. A signal distortion correction circuit 320 that includes non-overlapping clock generator 160 in LVDS receiver 300 includes a logic gate such as a NAND gate 325 to process the CK2_N and CK2_P signals to produce the signal distortion detection signal SIG_DET. As compared to LVDS receiver 100, an increase in the power supply voltage Vdd in LVDS receiver 300 causes the minimum value of the VO1_P and VO1_N voltages to rise. The signal distortion could thus cause the VO1_P and VO1_N voltages to not drop below the threshold voltage of inverters 350 and 325, respectively. Thus, should distortion cause the normally non-overlapping CK2_N and CK2_P signals to overlap and both equal to the power supply voltage Vdd simultaneously, the signal distortion detection signal SIG_DET will be discharged to switch on transistor P11 to cause the gate voltage Vgate of transistors P9 and P10 to rise. In this fashion, the VO1_P and VO1_N voltages will sufficiently toggle to cause the desired binary transitions in the VOUT_P and VOUT_N voltages. The CK2_P signal opens switch 310 when the CK2_P signal is discharged. Similarly, the CK2_N signal opens switch 315 with the CK2_N signal is discharged. In this fashion, LVDS receiver 300 has reduced power consumption and is robust to signal distortion analogously as discussed for LVDS receiver 100.

Figure 4:
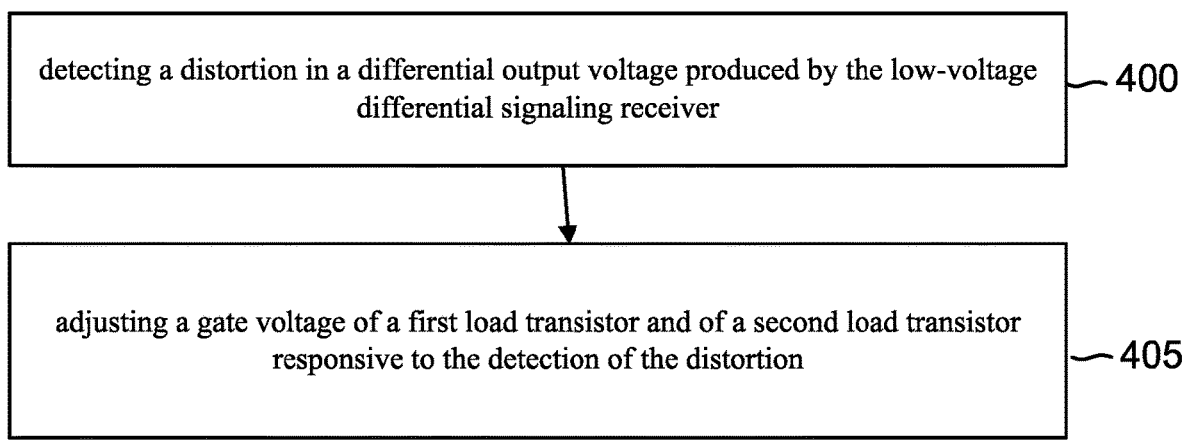
FIG. 4 is a flowchart for a method of operation of an LVDS receiver in accordance with an aspect of the disclosure.

An example method of operation of an LVDS receiver will now be discussed with respect to the flowchart of FIG. 4. The method includes an act 400 of detecting a distortion in a differential output voltage produced by the low-voltage differential signaling receiver. The detection by signal distortion detection circuit 120 or 320 is an example of act 400. In addition, the method includes an act 405 of adjusting a gate voltage of a first load transistor and of a second load transistor responsive to the detection of the distortion. The adjustment of the gate voltage Vgate in LVDS receiver 100 or 300 is an example of act 405.

Figure 5:
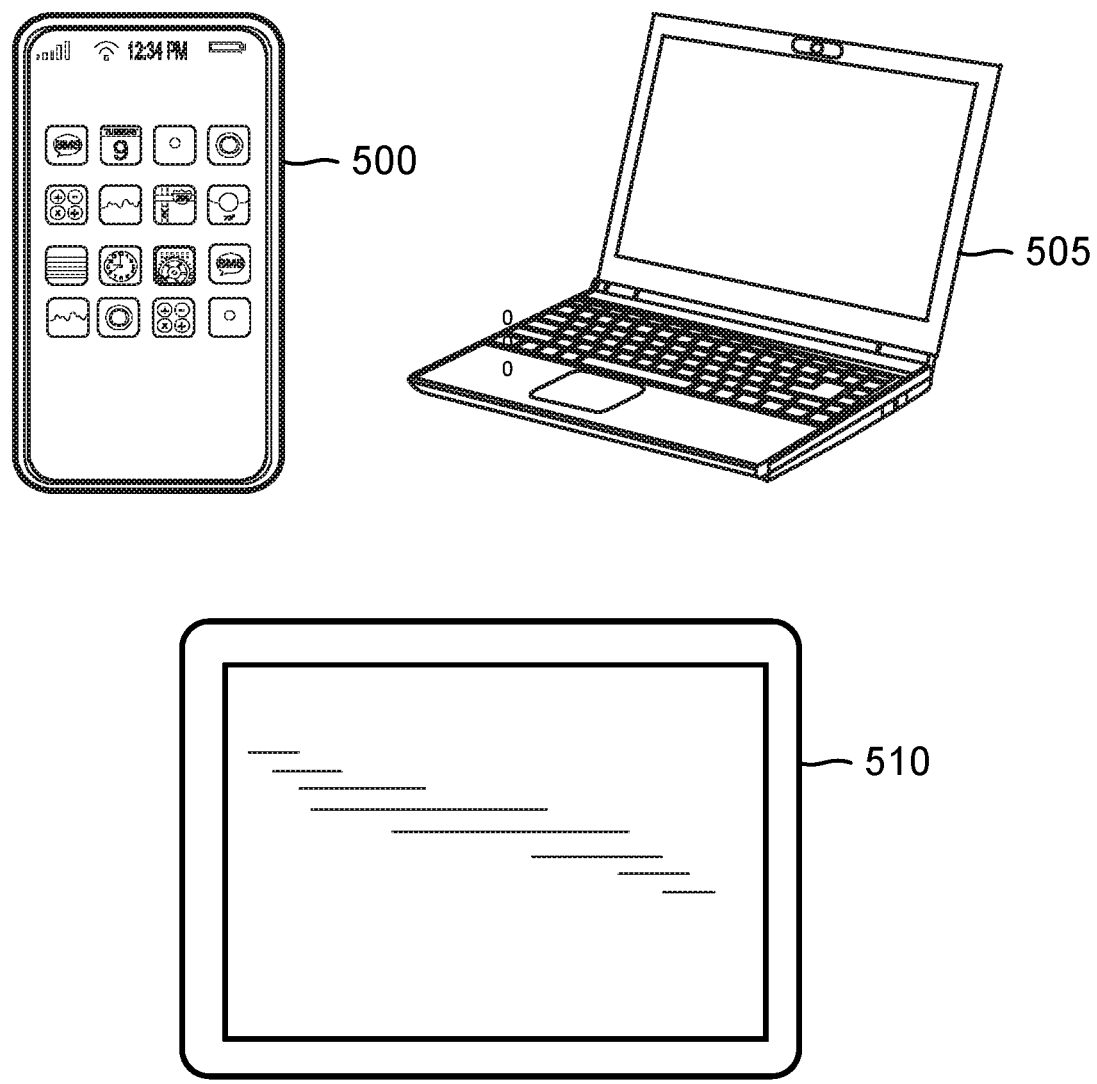
FIG. 5 illustrates some example electronic systems including an LVDS receiver in accordance with an aspect of the disclosure.

An LVDS receiver as disclosed herein may be incorporated in any suitable mobile device or electronic system. For example, as shown in FIG. 5, a cellular telephone 500, a laptop computer 505, and a tablet PC 510 may all include an LVDS receiver in accordance with the disclosure. Other exemplary electronic systems such as a music player, a video player, a communication device, and a personal computer may also be configured with an LVDS receiver constructed in accordance with the disclosure.

The disclosure will now be summarized in the following series of clauses:

Clause 1. A low-voltage differential signaling receiver, comprising:
- a differential pair of transistors configured to amplify a differential input voltage into a first differential voltage defined between a drain of a first transistor in the differential pair of transistors and a drain of a second transistor in the differential pair of transistors;
- a first current mirror configured to produce a first current responsive to a drain voltage of the first transistor;
- a first load transistor configured to conduct the first current to produce a first voltage, the first load transistor being selectively diode connected through a first switch;
- a second current mirror configured to produce a second current responsive to a drain voltage of the second transistor; and
- a second load transistor configured to conduct the second output current to produce a second voltage, the second load transistor being selectively diode connected through a second switch.

Clause 2. The low-voltage differential signaling receiver of clause 1, further comprising:
- a first inverter configured to invert the first voltage to produce a first output voltage; and
- a second inverter configured to invert the second voltage to produce a second output voltage.

Clause 3. The low-voltage differential signaling receiver of clause 2, further comprising:
- a non-overlapping clock generator configured to process the first output voltage and the second output voltage to produce a first clock signal and a second clock signal, wherein the first switch is configured to open and close responsive to the first clock signal and the second switch is configured to open and close responsive to the second clock signal.

Clause 4. The low-voltage differential signaling receiver of clause 3, wherein the non-overlapping clock generator comprises:
- a first logic gate configured to process the first output voltage; and
- a second logic gate configured to process the second output voltage.

Clause 5. The low-voltage differential signaling receiver of clause 4, wherein the first logic gate comprises a first NOR gate and the second logic gate comprises a second NOR gate, and wherein the non-overlapping clock generator further comprises:
- a first delay circuit configured to delay an output signal from the first NOR gate to form the first non-overlapping clock signal; and
- a second delay circuit configured to delay an output signal from the second NOR gate to form the second non-overlapping clock signal.

Clause 6. The low-voltage differential signaling receiver of clause 5, wherein the first delay circuit comprises at least one inverter and wherein the second delay circuit comprises at least one inverter.

Clause 7. The low-voltage differential signaling receiver of any of clauses 3-6, further comprising:
- a logic gate configured to process the first clock signal and the second clock signal to produce a signal distortion detection signal; and
- a third transistor coupled to a gate of the first load transistor and a gate of the second load transistor, wherein the third transistor includes a gate coupled to a node for the signal distortion detection signal.

Clause 8. The low-voltage differential signaling receiver of clause 7, wherein the first load transistor and the second load transistor each comprises an n-type metal-oxide semiconductor (NMOS) transistor having a source coupled to ground, and wherein the third transistor is an NMOS transistor having a source coupled to ground and a drain coupled to the gate of the first load transistor and to the gate of the second load transistor.

Clause 9. The low-voltage differential signaling receiver of clause 7, wherein the first load transistor and the second load transistor each comprises an p-type metal-oxide semiconductor (PMOS) transistor having a source coupled to ground, and wherein the third transistor is PMOS transistor having a source coupled to a power supply node and a drain coupled to the gate of the first load transistor and to the gate of the second load transistor.

Clause 10. The low-voltage differential signaling receiver of any of clauses 1-9, further comprising:
- a first cross-coupled transistor having a drain coupled to the drain of the first transistor; and
- a second cross-coupled transistor having a drain coupled to the drain of the second transistor, wherein a gate of the first cross-coupled transistor is coupled to a drain of the second cross-coupled transistor and a gate of the second cross-coupled transistor is coupled to the drain of the first cross-coupled transistor.

Clause 11. The low-voltage differential signaling receiver of clause 10, wherein the first transistor and the second transistor each comprises an NMOS transistor, and wherein the first cross-coupled transistor and the second cross-coupled transistor each comprises a PMOS transistor.

Clause 12. The low-voltage differential signaling receiver of clause 11, further comprising:
- a current source coupled between ground and a source of the first transistor and a source of the second transistor.

Clause 13. The low-voltage differential signaling receiver of clause 10, wherein the first transistor and the second transistor each comprises a PMOS transistor, and wherein the first cross-coupled transistor and the second cross-coupled transistor each comprises an NMOS transistor.

Clause 14. The low-voltage differential signaling receiver of clause 13, further comprising:

a current source coupled between a power supply node and a source of the first transistor and a source of the second transistor.

Clause 15. A method of receiving in a low-voltage differential signaling receiver, comprising;
   detecting a distortion in a differential output voltage produced by the low-voltage differential signaling receiver; and
   adjusting a gate voltage of a first load transistor and of a second load transistor responsive to the detection of the distortion.

Clause 16. The method of clause 15, wherein the differential output voltage comprises a difference between a first output voltage and a second output voltage, the method further comprising:
   amplifying a differential input voltage to produce a first voltage at a drain of the first load transistor and a second voltage at a drain of the second load transistor;
   inverting the first voltage to produce the first output voltage; and
   inverting the second voltage to produce the second output voltage.

Clause 17. The method of clause 16, further comprising:
   opening a diode connection of the first load transistor in response to the first output voltage rising to equal a power supply voltage while the second output voltage discharges to ground; and
   closing the diode connection of the first load transistor in response to the second output voltage rising to equal the power supply voltage while the first output voltage discharges to ground.

Clause 18. The method of clause 17, further comprising:
   opening a diode connection of the second load transistor in response to the second output voltage rising to equal the power supply voltage while the first output voltage discharges to ground; and
   closing the diode connection of the second load transistor in response to the first output voltage rising to equal the power supply voltage while the second output voltage discharges to ground.

Clause 19. The method of clause 15, wherein the adjusting of the gate voltage of the first load transistor and of the second load transistor reduces the distortion in the differential output voltage.

Clause 20. The method of clause 19, wherein the distortion in the differential output voltage comprises a duty cycle distortion.

Clause 21. A low-voltage differential signaling receiver, comprising:
   a non-overlapping clock generator configured to generate a pair of clock signals responsive to a differential output voltage;
   a logic gate configured to process the pair of clock signals to produce a signal distortion detection signal at an output terminal of the logic gate;
   a differential amplifier including a first load transistor and a second load transistor; and
   a third transistor coupled between ground and a gate of the first load transistor and a gate of the second load transistor, the third transistor having a gate coupled to the output terminal of the logic gate.

Clause 22. The low-voltage differential signaling receiver of clause 21, further comprising:
   a first switch coupled between a drain and a source of the first load transistor, the first switch being configured to open and close responsive to a first clock signal in the pair of clock signals; and
   a first switch coupled between a drain and a source of the second load transistor, the second switch being configured to open and close responsive to a second clock signal in the pair of clock signals.

Clause 23. The low-voltage differential signaling receiver of clause 21, wherein the logic gate comprises an AND gate.

Clause 24. A low-voltage differential signaling receiver, comprising:
   a non-overlapping clock generator configured to generate a pair of clock signals responsive to a differential output voltage;
   a logic gate configured to process the pair of clock signals to produce a signal distortion detection signal at an output terminal of the logic gate;
   a differential amplifier including a first load transistor and a second load transistor; and
   a third transistor coupled between a power supply node and a gate of the first load transistor and a gate of the second load transistor, the third transistor having a gate coupled to the output terminal of the logic gate.

Clause 25. The low-voltage differential signaling receiver of clause 24, further comprising:
   a first switch coupled between a drain and a source of the first load transistor, the first switch being configured to open and close responsive to a first clock signal in the pair of clock signals; and
   a second switch coupled between a drain and a source of the second load transistor, the second switch being configured to open and close responsive to a second clock signal in the pair of clock signals.

Clause 26. The low-voltage differential signaling receiver of clause 24, wherein the logic gate comprises a NAND gate.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A low-voltage differential signaling receiver, comprising:
   a differential pair of transistors configured to amplify a differential input voltage into a first differential voltage defined between a drain of a first transistor in the differential pair of transistors and a drain of a second transistor in the differential pair of transistors;
   a first current mirror configured to produce a first current responsive to a drain voltage of the first transistor;
   a first load transistor configured to conduct the first current to produce a first voltage, the first load transistor being selectively diode connected through a first switch;
   a second current mirror configured to produce a second current responsive to a drain voltage of the second transistor; and
   a second load transistor configured to conduct the second output current to produce a second voltage, the second load transistor being selectively diode connected through a second switch.

2. The low-voltage differential signaling receiver of claim 1, further comprising:
   a first inverter configured to invert the first voltage to produce a first output voltage; and a second inverter configured to invert the second voltage to produce a second output voltage.

3. The low-voltage differential signaling receiver of claim 2, further comprising:
a non-overlapping clock generator configured to process the first output voltage and the second output voltage to produce a first clock signal and a second clock signal, wherein the first switch is configured to open and close responsive to the first clock signal and the second switch is configured to open and close responsive to the second clock signal.

4. The low-voltage differential signaling receiver of claim 3, wherein the non-overlapping clock generator comprises:
a first logic gate configured to process the first output voltage; and
a second logic gate configured to process the second output voltage.

5. The low-voltage differential signaling receiver of claim 4, wherein the first logic gate comprises a first NOR gate and the second logic gate comprises a second NOR gate, and wherein the non-overlapping clock generator further comprises:
a first delay circuit configured to delay an output signal from the first NOR gate to form the first clock signal; and
a second delay circuit configured to delay an output signal from the second NOR gate to form the second clock signal.

6. The low-voltage differential signaling receiver of claim 5, wherein the first delay circuit comprises at least one inverter and wherein the second delay circuit comprises at least one inverter.

7. The low-voltage differential signaling receiver of claim 3, further comprising:
a logic gate configured to process the first clock signal and the second clock signal to produce a signal distortion detection signal; and
a third transistor coupled to a gate of the first load transistor and a gate of the second load transistor, wherein the third transistor includes a gate coupled to a node for the signal distortion detection signal.

8. The low-voltage differential signaling receiver of claim 7, wherein the first load transistor and the second load transistor each comprises an n-type metal-oxide semiconductor (NMOS) transistor having a source coupled to ground, and wherein the third transistor is an NMOS transistor having a source coupled to ground and a drain coupled to the gate of the first load transistor and to the gate of the second load transistor.

9. The low-voltage differential signaling receiver of claim 7, wherein the first load transistor and the second load transistor each comprises an p-type metal-oxide semiconductor (PMOS) transistor having a source coupled to ground, and wherein the third transistor is PMOS transistor having a source coupled to a power supply node and a drain coupled to the gate of the first load transistor and to the gate of the second load transistor.

10. The low-voltage differential signaling receiver of claim 1, further comprising:
a first cross-coupled transistor having a drain coupled to the drain of the first transistor; and
a second cross-coupled transistor having a drain coupled to the drain of the second transistor, wherein a gate of the first cross-coupled transistor is coupled to a drain of the second cross-coupled transistor and a gate of the second cross-coupled transistor is coupled to the drain of the first cross-coupled transistor.

11. The low-voltage differential signaling receiver of claim 10, wherein the first transistor and the second transistor each comprises an NMOS transistor, and wherein the first cross-coupled transistor and the second cross-coupled transistor each comprises a PMOS transistor.

12. The low-voltage differential signaling receiver of claim 11, further comprising:
a current source coupled between ground and a source of the first transistor and a source of the second transistor.

13. The low-voltage differential signaling receiver of claim 10, wherein the first transistor and the second transistor each comprises a PMOS transistor, and wherein the first cross-coupled transistor and the second cross-coupled transistor each comprises an NMOS transistor.

14. The low-voltage differential signaling receiver of claim 13, further comprising:
a current source coupled between a power supply node and a source of the first transistor and a source of the second transistor.

15. A low-voltage differential signaling receiver, comprising:
a non-overlapping clock generator configured to generate a pair of clock signals responsive to a differential output voltage;
a logic gate configured to process the pair of clock signals to produce a signal distortion detection signal at an output terminal of the logic gate;
a differential amplifier including a first load transistor and a second load transistor; and
a third transistor coupled between ground and a gate of the first load transistor and a gate of the second load transistor, the third transistor having a gate coupled to the output terminal of the logic gate.

16. The low-voltage differential signaling receiver of claim 15, further comprising:
a first switch coupled between a drain and a source of the first load transistor, the first switch being configured to open and close responsive to a first clock signal in the pair of clock signals; and
a first switch coupled between a drain and a source of the second load transistor, the second switch being configured to open and close responsive to a second clock signal in the pair of clock signals.

17. The low-voltage differential signaling receiver of claim 15, wherein the logic gate comprises an AND gate.

18. A low-voltage differential signaling receiver, comprising:
a non-overlapping clock generator configured to generate a pair of clock signals responsive to a differential output voltage;
a logic gate configured to process the pair of clock signals to produce a signal distortion detection signal at an output terminal of the logic gate;
a differential amplifier including a first load transistor and a second load transistor; and
a third transistor coupled between a power supply node and a gate of the first load transistor and a gate of the second load transistor, the third transistor having a gate coupled to the output terminal of the logic gate.

19. The low-voltage differential signaling receiver of claim 18, further comprising:
a first switch coupled between a drain and a source of the first load transistor, the first switch being configured to open and close responsive to a first clock signal in the pair of clock signals; and
a second switch coupled between a drain and a source of the second load transistor, the second switch being configured to open and close responsive to a second clock signal in the pair of clock signals.

20. The low-voltage differential signaling receiver of claim 18, wherein the logic gate comprises a NAND gate.

* * * * *